United States Patent [19]

Carlson et al.

[11] 4,077,558
[45] Mar. 7, 1978

[54] DIFFUSION BONDING OF CRYSTALS

[75] Inventors: Jeffrey Allen Carlson; Bradford Clyde Schwartz, both of Longmont; Gerald Steving, Berthoud, all of Colo.

[73] Assignee: International Business Machines Corporation, Armonk, N.Y.

[21] Appl. No.: 748,249

[22] Filed: Dec. 6, 1976

[51] Int. Cl.² .......................................... B23K 31/02
[52] U.S. Cl. ................................................. 228/121
[58] Field of Search .................... 228/121, 193–195; 29/25.35

[56] References Cited

U.S. PATENT DOCUMENTS

| | | | |
|---|---|---|---|
| 3,111,741 | 11/1963 | Allen | 29/25.35 |
| 3,128,545 | 4/1964 | Cooper | 228/121 |
| 3,252,722 | 5/1966 | Allen | 228/121 X |
| 3,432,913 | 3/1969 | Bronnes | 228/121 |
| 3,448,503 | 6/1969 | Radford | 29/25.35 |
| 3,590,467 | 7/1971 | Chase | 228/121 X |
| 3,893,229 | 7/1975 | Aird | 29/589 |
| 3,921,885 | 11/1975 | Knox | 228/121 X |

Primary Examiner—Donald G. Kelly
Attorney, Agent, or Firm—William N. Hogg

[57] ABSTRACT

A method of bonding two crystals together is disclosed. A bond enhancing material such as chromium (Cr) is vapor deposited on one crystal, and on this is vapor deposited a noble metal such as gold (Au). On the other crystal a low melting point metal such as tin (Sn) or indium (In) is vapor deposited. In the case of In this can either be directly on the crystal or on a layer of bond enhancing material; in the case of Sn this must be on a bond enhancing material. On top of the low melting point metal a layer of the same noble metal is deposited to prevent oxidation thereof. The noble metal layers are brought into contact with each other in vacuum or inert atmosphere and pressure applied thereto at a temperature of 100° C to 150° C in the case of In and 100° C to 200° C in the case of Sn. The low melting point metal will diffuse into the noble metals and across the interface causing a bond to form by elimination of the boundary between the crystals.

24 Claims, 2 Drawing Figures

DIFFUSION BONDING OF CRYSTALS

BACKGROUND OF THE INVENTION

The present invention relates generally to the bonding of two crystals of material together and more particularly is concerned with a method of bonding together two crystal components to form an acoustical-optical device. Acoustical-optical devices are generally comprised of a piezoelectric crystal bonded to an optical diffraction crystal. The bond between these two types of crystals must have good mechanical strength, controlled thickness and also must be formed of a material which will effectively transmit acoustical energy.

It is known in the prior art to bond crystals together by the use of low melting point alloys and pressure fusing under relatively low temperatures. For example, U.S. Pat. No. 3,252,722 to Allen, discloses the deposition of a layer of indium on one crystal and a layer of gold on the opposite crystal and thereafter, pressure bonding or fusing the gold to the indium. Another technique for bonding is disclosed in U.S. Pat. No. 3,921,885 to Knox wherein, each of the crystals is first coated with a chromium film and thereafter each is coated with aluminum film, thereover; following which each is coated with a gold film. Thereafter, pressure is applied to cause a bonding of the two gold layers.

Each of these two patents has several serious limitations. The Allen patent has the problem of oxidation of the layer of indium and thus if there is any exposure to the air, the indium surface must be burnished as is suggested therein with a clean nylon parachute cloth. This is a mechanical operation and constitutes the physical removal of an oxide film which film is unwanted and deleterious to bonding. Also, there is associated with this technique, the necessity of regulating the amount of burnishing to assure that proper surfaces and thickness are provided.

The Knox patent requires very high pressures and the quality of the bonds is not always at the desired level. Further there is no low melting point alloy used to provide the desired bond which is disclosed in the Allen patent teaching.

Other teachings relate to the manufacture of crystals using soldering type modes, e.g., U.S. Pat. No. 3,111,741 to Allen, and high temperature bonding such as shown in U.S. Pat. No. 2,618,579 to Brajer. These techniques also have many limitations.

SUMMARY OF THE PRESENT INVENTION

According to the present invention a method of bonding two crystals of material together is disclosed. On one of the crystals there is vapor deposited, a bond enhancing material selected from the group titanium, chromium and aluminum; thereafter there is vapor deposited on this bond enhancing material a layer of a noble metal, preferably gold, platinum or palladium. On the other crystal there is vapor deposited, a low melting point metal selected from the group consisting of tin and indium. This may either be vapor deposited directly on the crystal in the case of indium or may be deposited on a bond enhancing material such as titanium, chromium or aluminum which has been deposited onto the crystal in the case of Sn and In. On top of the low melting point alloy on this other crystal there is vapor deposited a layer of said noble metal to prevent oxidation of the low melting point metal. Deposition takes place before the low melting point material is exposed to the atmosphere. At this time the material may be exposed to the atmosphere without harm. Thereafter, the noble metal layers are brought together under pressure of at least 50 PSI at a temperature of between 100° C and 200° C depending upon the combination of low melting point metal and noble metal. A bond is formed by diffusion across the interface of the noble metal and low melting point alloy.

The foregoing and other objects, features, and advantages of the invention will be apparent from the following more particular description of preferred embodiments of the invention, as illustrated in the accompanying drawings.

DESCRIPTION OF THE PREFERRED EMBODIMENT

Figure 1:
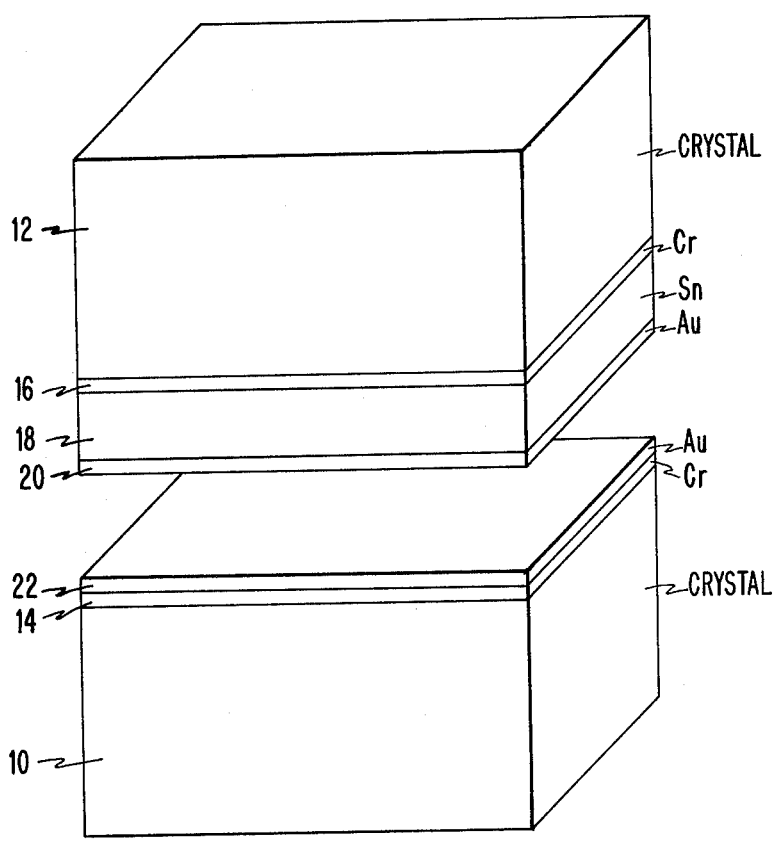
FIG. 1 is a perspective view of a pair of crystals superposed on each other showing vapor deposited on each of the successive layers of materials in preparation for pressure bonding of the two crystals together.

Referring now to the drawings, a pair of crystal materials to be bonded together is shown which crystals in the preferred embodiment take the form of a piezoelectric crystal 10 and an optical deflection crystal 12. This constitutes the preferred embodiment for the bonding to form an acousto-optic modulator.

A layer of bond enhancing material 14 is deposited onto the crystal 10. (This and the other layers of material are not shown to scale.) There are several materials which are well suited for this bond enhancing function, such as chromium, titanium and aluminum. It is necessary to have such a bond enhancing material interposed between a noble metal and a crystal to insure proper bonding of a noble metal to a crystal material. The thickness of this bond enhancing material should be between about 100 and 500 angstroms.

A bond enhancing material 16 is deposited onto the crystal 12; however, this is not essential in the case where In is the low melting point metal since In normally will have good bonding characteristics with respect to the crystal; such bond enhancing material is required where Sn is the low melting point metal.

As shown in the preferred embodiment, a low melting point alloy, having good acoustical match to the selected piezoelectric crystal and the diffraction crystal is vapor deposited onto the bond enhancing material 16 and designated by the reference character 18. (As noted above however, in the case of In this could be deposited directly onto the crystal 12 if desired. The low melting point material is preferably indium or tin, each of which has the necessary acoustical properties and low melting point.) The thickness of this low melting point material is dependent upon the flatness of the two crystals which normally will require a metal thickness of at least 1,000 Angstroms and can be substantially thicker.

On top of the low melting point material is vapor deposited a noble metal 20 such as gold, platinum or palladium. Gold is the preferred material, although platinum or palladium can also be used.

The noble metal is deposited on top of a low melting point alloy, serving three purposes. (1) It provides a protective layer over the indium to prevent oxidation and allow crystal exposure to the atmosphere. (In fact, the crystals may be exposed to air for substantial periods of time without deleterious effects on the bonding process.) (2) The gold ind Indium layers act as a diffusion couple which, when heated, will eliminate the boundary between the crystals. (3) The gold increases the acoustical impedance of indium which is often an advantage to more closely match the impedance of the component crystals.

Vapor deposited onto the bond enhancing material 14 on the crystal 10 is another layer of noble metal 22 which again is preferably gold. Of course the noble metals should be the same for each layer. It is necessary to have the gold layer 22 in order to provide the necessary metal for diffusion bonding to the material on the opposite crystal which in this case is the gold layer 20, since the material on the opposite crystal can not bond directly to the crystal 10 or the bond enhancing material 14 by pressure bonding. Therefore, the gold layer 22 is required for providing a necessary bonding metal. It should be noted however, that the gold layer 20 is not required for bonding purposes since the gold layer 22 could bond directly to the low melting point material 18. However, the gold layer 20 is provided over the low melting point material 18 to prevent the oxidation thereof, provide a diffusion couple, and increase the impedance. In preventing oxidation however, a compatible material is provided which is compatible with the gold 22 on the crystal 10.

When the crystals 10 and 12 have been prepared with the layers as shown in FIG. 1, they are then placed in a vacuum chamber or inert atmosphere with the gold layers 20 and 22 in contact with each other and pressure applied. The applied pressure should be at least 50 pounds per-square-inch but can be increased substantially up to any reasonable value in which the crystals are not damaged.

The bonding temperature should be between 100° C and 150° C for optimum results when the materials are gold and indium and up to 200° C for gold and tin. When the temperature is less than 100° C the time required is quite long. With less than 33% Au a low melting eutectic is formed, hence a temperature above 150° C may cause undesirable melting. In the case of Au and Sn a similar but higher melting point eutectic is present with about 95% Sn and 5% Au.

Figure 2:
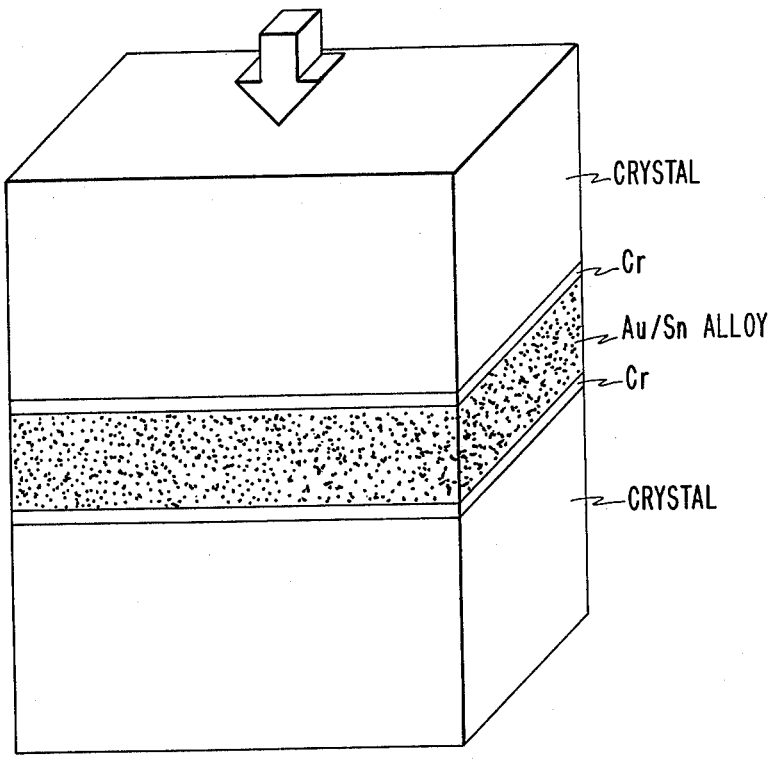
FIG. 2 is a perspective view of the two different crystals bonded together under pressure and indicating schematically the diffusion of the low melting point alloy and the gold.

In forming the bond, gold from the layer 20 will start to diffuse into the indium layer 18, and the indium in layer 18 will diffuse into the gold layer 20, and thus the boundary between the layers 18 and 20 will be eliminated. When the indium atoms reach the boundary between the gold layers 20 and 22, they will cross this boundary. The Au atoms from layer 22 will migrate across the Au-Au boundary and toward the In layer 18. This will cause the boundary between the layers of gold 18 and 20 to disappear. The end result will be that the original layers 18, 20 and 22 will have formed into an essentially boundaryless interface alloy of In and Au is present between the crystals. This diffusion is shown somewhat diagramatically in FIG. 2.

The relative rates of diffusion can be predicted from an Arrhenius type equation having the general form:

$$D = D_o e^{-Q/RT}$$

The diffusivity ($D$) at a given temperature ($T$) is mainly dependent on the activation energy ($Q$) of the process. The lower the activation energy, the more readily atomic transport will occur. Listed in Table I below are energy values for the three possible processes in the Au-In system which will affect bonding. Although the diffusivity is affected by alloy composition, these ideal values provide an estimate of the processes which will occur with time in the low melting point material. Calculations were made that predict diffusion of indium in gold will be the predominate process in the range of about 140° C. This system is several thousand times faster than gold self diffusion.

TABLE I

| SYSTEM | D. (cm²/sec) | Q(cal/mole/° K) | $D_{140° C}$ cm²/sec |
|---|---|---|---|
| indium in indium | 2.700 | 18,700 | $3.97 \times 10^{-10}$ |
| gold in gold | 0.091 | 41,700 | $1.08 \times 10^{-23}$ |
| indium in gold | 0.056 | 15,620 | $3.43 \times 10^{-10}$ |

Other combinations of noble metals and low melting point metals according to this invention show similar propensities.

Therefore the logical sequence of diffusion between the couple shown in FIG. 1 will be the following: Gold from layer 20 will first diffuse into the low melting point metal layer 18 until sufficient mixing has taken place to permit some low melting point metal atoms to reach the interface. Next gold will transfer from layer 22 across the boundary between the gold layers to exchange with the low melting point atoms which have migrated to the surface. This transfer across the interface results in the solid state diffusion bond. Oxidation of low melting point alloy is not a problem since the gold surface layer provides protection until the indium or tin atoms reach the surface.

A relatively high vacuum in the order of magnitude of $10^{-6}$ torr can be used to perform the bonding operation. (Inert atmosphere could also be used.) The principal purpose of the vacuum is to insure that there is no atmosphere present which will cause oxidation of the materials during the bonding process and thus prevent effective bonding.

In order to provide the proper bond, the thickness of the gold layers should be between about 300 Angstroms and 2,000 Angstroms and will depend upon the thermal expansion coefficients of the substrates.

The maximum thickness of the entire bonding layer between the two crystals including the bond enhancing material, and of the gold and the low temperature melting point metal may be anywhere from about 2,000 Angtroms up to 50,000 Angstroms depending on the frequency of the acoustic piezoelectric crystal. Other crystal bonding applications could require even greater thicknesses.

The method of the present invention provides a very simple and relatively reliable method of bonding two crystals together. For example, both of the crystals can be prepared and simultaneously vapor deposited with the bond enhancing material. Thereafter, one of the crystals can be masked while the low melting point alloy is vapor deposited onto the other crystal. Following this, the masking can be removed from the one crystal and the gold vapor deposited onto both crystals simultaneously. This technique insures uniformity of film thickness and quality as well as providing a simple technique and a technique which prevents unintentional oxidation of the low melting point alloy.

It should also be noted that the low melting point alloy is to be deposited only on one crystal and not both.

While the invention has been particularly shown and described with reference to a preferred embodiment thereof, it will be understood by those skilled in the art that various changes in form and details may be made therein without departing from the spirit and scope of the invention.

What is claimed is:

1. A method of bonding two crystals together comprising the steps of:
   depositing a layer of bond enhancing material on one of said crystals;
   depositing a layer of a noble metal on said bond enhancing material;
   depositing on said other crystal a low melting point metal selected from the group Sn and In;
   depositing a layer of noble metal on said low melting point metal to prevent oxidation thereof; and
   bringing together the noble metal layers at a temperature of between 100° C and 200° C and applying a pressure in excess of 50 pounds per-square-inch to cause a diffusion bond between the noble metal atoms and the low melting point metal atoms.

2. The invention as defined in claim 1 wherein said metals are vapor deposited.

3. The invention as defined in claim 1 wherein said bond enhancing material is selected from the group Cr, Ti, and Al.

4. The invention as defined in claim 1 wherein a layer of bond enhancing material is deposited on said other crystal beneath said low melting point metal.

5. The invention as defined in claim 1 wherein said low melting point metal is In and is deposited directly on said other crystal without an intermediate layer of bond enhancing metal.

6. The invention as defined in claim 4 wherein the low melting point metal is Sn.

7. The invention as defined in claim 1 wherein the thickness of the noble metal layer is between about 300 and 2,000 Angtroms.

8. The invention as defined in claim 4 wherein the thickness of each layer of the bond enhancing material is from about 100 to about 500 Angstroms.

9. The invention as defined in claim 1 wherein the noble metal is selected from the group gold, platinum and palladium.

10. The invention as defined in claim 1 wherein the low melting point metal is In, and the temperature is less then about 150° C.

11. The invention as defined in claim 1 which said noble metal is gold.

12. The invention as defined in claim 4 wherein the bond enhancing metal is Cr.

13. The invention as defined in claim 4 wherein the bond enhancing material is Ti.

14. The invention as defined in claim 4 wherein the bond enhancing material is Al.

15. The invention as defined in claim 1 wherein the total thickness of the metals is between about 2,000 Angtroms and about 50,000 Angstroms.

16. In a bonding process wherein one crystal material is bonded to another crystal material and wherein a noble metal is deposited on one crystal and a low melting point metal is deposited on the other crystal material, the improvement comprising, depositing a layer of said nobel metal on said low melting point metal whereby to prevent oxidation of the surface thereof, and thereafter bonding said materials by application of pressure with said noble metal layers in contact with each other to form a diffusion bond between said noble metal atoms and said low melting point metal atoms.

17. The invention as defined in claim 16 wherein a layer of bond enhancing material is deposited on said other crystal below said low melting point metal.

18. The invention as defined in claim 17 wherein the bond enhancing material is selected from the group Ti, Cr and Al.

19. The invention as defined in claim 17 wherein the low melting point metal is selected from the group of tin and indium.

20. The invention as defined in claim 16 wherein the noble metal is selected from the group gold, platinum and palladium.

21. The invention as defined in claim 20 wherein the thickness of each of the layers of the noble metal is between about 300 and 2,000 Angstroms.

22. The invention as defined in claim 16 wherein the metals are vapor deposited.

23. The method of claim 19 wherein the temperature of the bonding is between about 100° C and about 150° C, and the low melting point metal is In.

24. The invention as defined in claim 19 wherein the temperature is between 100° C and 200° C and the low melting point metal is Sn.